(12) United States Patent
Sasaki

(10) Patent No.: US 12,154,874 B2
(45) Date of Patent: Nov. 26, 2024

(54) SEMICONDUCTOR DEVICE

(71) Applicant: SONY SEMICONDUCTOR SOLUTIONS CORPORATION, Kanagawa (JP)

(72) Inventor: Naoto Sasaki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 479 days.

(21) Appl. No.: 17/299,665

(22) PCT Filed: Dec. 4, 2019

(86) PCT No.: PCT/JP2019/047341
§ 371 (c)(1),
(2) Date: Jun. 3, 2021

(87) PCT Pub. No.: WO2020/129635
PCT Pub. Date: Jun. 25, 2020

(65) Prior Publication Data
US 2022/0037272 A1    Feb. 3, 2022

(30) Foreign Application Priority Data

Dec. 18, 2018  (JP) .................. 2018-236071

(51) Int. Cl.
*H01L 23/00*     (2006.01)
*H01L 27/146*    (2006.01)
*H01L 21/768*    (2006.01)

(52) U.S. Cl.
CPC .............. *H01L 24/02* (2013.01); *H01L 24/05* (2013.01); *H01L 27/14636* (2013.01); *H01L 21/76898* (2013.01); *H01L 24/13* (2013.01); *H01L 24/16* (2013.01); *H01L 27/14634* (2013.01); *H01L 2224/02311* (2013.01); *H01L 2224/0235* (2013.01); *H01L 2224/02372* (2013.01);
(Continued)

(58) Field of Classification Search
CPC ... H01L 24/02; H01L 24/05; H01L 27/14634; H01L 2224/0235; H01L 2224/02372; H01L 2224/02381; H01L 2224/05548
USPC ........................................................ 257/621
See application file for complete search history.

(56) References Cited

U.S. PATENT DOCUMENTS

2008/0284041 A1* 11/2008 Jang ................... H01L 21/76898
257/774
2011/0278735 A1  11/2011 Yen
(Continued)

FOREIGN PATENT DOCUMENTS

CN   101355069 A   1/2009
CN   102473640 A   5/2012
(Continued)

OTHER PUBLICATIONS

International Search Report prepared by the Japan Patent Office on Feb. 25, 2020, for International Application No. PCT/JP2019/047341.

*Primary Examiner* — Jami Valentine Miller
(74) *Attorney, Agent, or Firm* — SHERIDAN ROSS P.C.

(57) ABSTRACT

A semiconductor device according to the present disclosure includes a board and a via. In the board, a wiring layer is embedded. The via extends in a depth direction from a main surface of the board to pierce through the wiring layer, and is connected to the wiring layer on a side peripheral surface.

13 Claims, 7 Drawing Sheets

(52) U.S. Cl.
CPC ......... *H01L 2224/02381* (2013.01); *H01L 2224/05548* (2013.01); *H01L 2224/13024* (2013.01); *H01L 2224/16227* (2013.01)

(56) References Cited

U.S. PATENT DOCUMENTS

| | | |
|---|---|---|
| 2011/0304026 A1 | 12/2011 | Tsui |
| 2012/0112301 A1 | 5/2012 | Humpston |
| 2012/0181672 A1 | 7/2012 | Lou |
| 2013/0234341 A1 | 9/2013 | Ona |
| 2016/0351521 A1 | 12/2016 | Kume et al. |
| 2020/0027784 A1* | 1/2020 | Park ............... H01L 23/481 |
| 2020/0119126 A1* | 4/2020 | Jo ............... H10K 59/131 |

FOREIGN PATENT DOCUMENTS

| | | |
|---|---|---|
| CN | 102593094 A | 7/2012 |
| CN | 103283025 A | 9/2013 |
| JP | 2008-288595 | 11/2008 |
| JP | 2009-206253 | 9/2009 |
| JP | 2012-099548 | 5/2012 |
| JP | 2012-190900 | 10/2012 |
| JP | 2016-225471 | 12/2016 |
| KR | 20080101635 A | 11/2008 |
| TW | 201401474 A | 1/2014 |
| TW | 201843769 A | 12/2018 |

\* cited by examiner

SEMICONDUCTOR DEVICE

CROSS REFERENCE TO RELATED APPLICATIONS

This application is a national stage application under 35 U.S.C. 371 and claims the benefit of PCT Application No. PCT/JP2019/047341 having an international filing date of 4 Dec. 2019, which designated the United States, which PCT application claimed the benefit of Japanese Patent Application No. 2018-236071 filed 18 Dec. 2018, the entire disclosures of each of which are incorporated herein by reference.

FIELD

The present disclosure relates to a semiconductor device.

BACKGROUND

Semiconductor devices in chip size package (CSP) include a through silicon via (TSV) that connects a wiring layer in a package and a connecting terminal on a mounting board (for example, refer to Patent Literature 1).

When a TSV is formed, generally, a through hole that reaches a wiring layer inside a package is formed from a rear surface of a board first, and then the through hole is covered with a seed metal film. Thereafter, on a surface of the seed metal film, a Re distribution layer (RDL) film, such as copper film, is grown, for example, by electroplating or the like to form the TSV.

CITATION LIST

Patent Literature

Patent Literature 1: JP-A-2009-206253

SUMMARY

Technical Problem

However, in the conventional technique described above, a step disconnection can occur in a seed metal film, and the RDL film cannot grow normally at a step disconnection portion of the seed metal film, to cause a faulty connection in TSV. This can reduce yields of semiconductor devices.

In view of the above problems, the present disclosure proposes a semiconductor device that can suppress reduction of yields.

Solution to Problem

A semiconductor device according to the present disclosure includes a board and a via. In the board, a wiring layer is embedded. The via extends in a depth direction from a main surface of the board to pierce through the wiring layer, and is connected to the wiring layer on a side peripheral surface.

DESCRIPTION OF EMBODIMENTS

Hereinafter, an embodiment of the present disclosure will be explained in detail with reference to the drawings. In the following embodiment, like reference signs are assigned to like parts, and duplicated explanation will be thereby omitted.

Structure of Semiconductor Device

Figure 1:
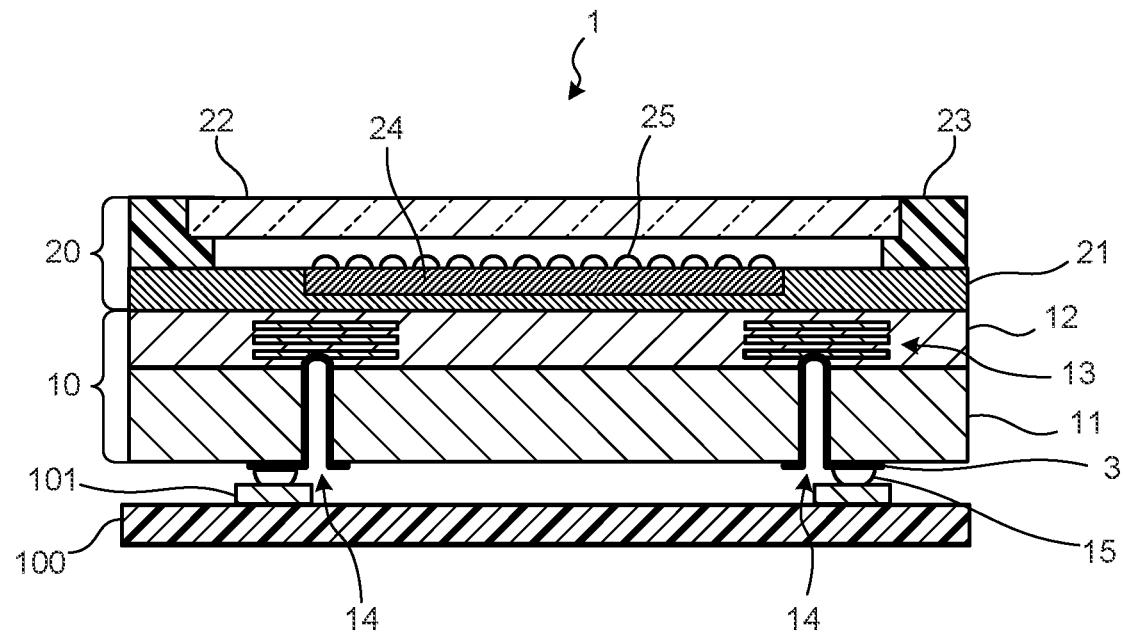
FIG. 1 is an explanatory diagram illustrating a cross-section of a semiconductor device according to an embodiment of the present disclosure.

First, a structure of a semiconductor device 1 according to the present disclosure will be explained, referring to FIG. 1. FIG. 1 is an explanatory diagram illustrating a cross-section of the semiconductor device 1 according to an embodiment of the present disclosure. It will be explained herein with a case in which the semiconductor device 1 according to the embodiment is a chip size package (CSP) stacked image sensor as an example, but the semiconductor device according to the embodiment may be any semiconductor device having a through silicon via (TSV).

As illustrated in FIG. 1, the semiconductor device 1 is used mounted on a mounting board 100. The semiconductor device 1 includes, for example, a logic board 10, and a sensor board 20 that is laminated on the logic board 10.

The logic board 10 includes Si (silicon) substrate 11 and an insulation layer 12 that is formed with SiO (silicon monoxide) laminated on the Si substrate 11 or the like. Inside the insulation layer 12, a multi-layered wiring layer 13 is embedded. Although illustration is omitted, inside the insulation layer 12, a signal processing circuit, a memory, or the like are arranged other than the multi-layered wiring layer 13.

The sensor board 20 includes an Si substrate 21, a glass cover 22 that is arranged on the Si substrate 21, and a supporting member 23 that supports a periphery portion of the glass cover 22. Inside the Si substrate 21, for example, a back-illuminated complementary metal oxide semiconductor (CMOS) image sensor 24 is arranged. Moreover, on a light receiving surface of each of a plurality of light receiving devices included in the CMOS image sensor 24, a micro lens 25 is arranged.

Furthermore, the CSP semiconductor device 1 includes a TSV 14 to connect the multi-layered wiring layer 13 arranged inside the logic board 10 and a connecting terminal 101 arranged on the mounting board 100.

The TSV 14 is a kind of a through electrode that is formed by making a redistribution layer (RDL) film 3 of, for example, a copper film, or the like so as to extend from an inner peripheral surface of a through hole formed from a bottom surface of the logic board 10 to reach the multi-layered wiring layer 13, to a part of the bottom surface of the logic board 10.

The semiconductor device 1 is mounted on the mounting board 100 as a portion of the RDL film 3 extending to the bottom surface of the logic board 10 is connected to the connecting terminal 101 through a solder bump 15.

As described, in the CSP semiconductor device 1, the RDL film 3 of the TSV 14 is directly connected with the connecting terminal 101 of the mounting board 100 through the solder bump 15 without using a bonding wire and, therefore, a mounting area can be suppressed to be minimum.

In the present embodiment, by contriving the shape of the TSV 14, occurrence of faulty connection in the TSV 14 is suppressed, and the yields of the semiconductor device 1 is thereby improved. Next, a specific structure of the TSV 14 will be explained, referring to FIG. 2.

Structure of TSV

Figure 2:
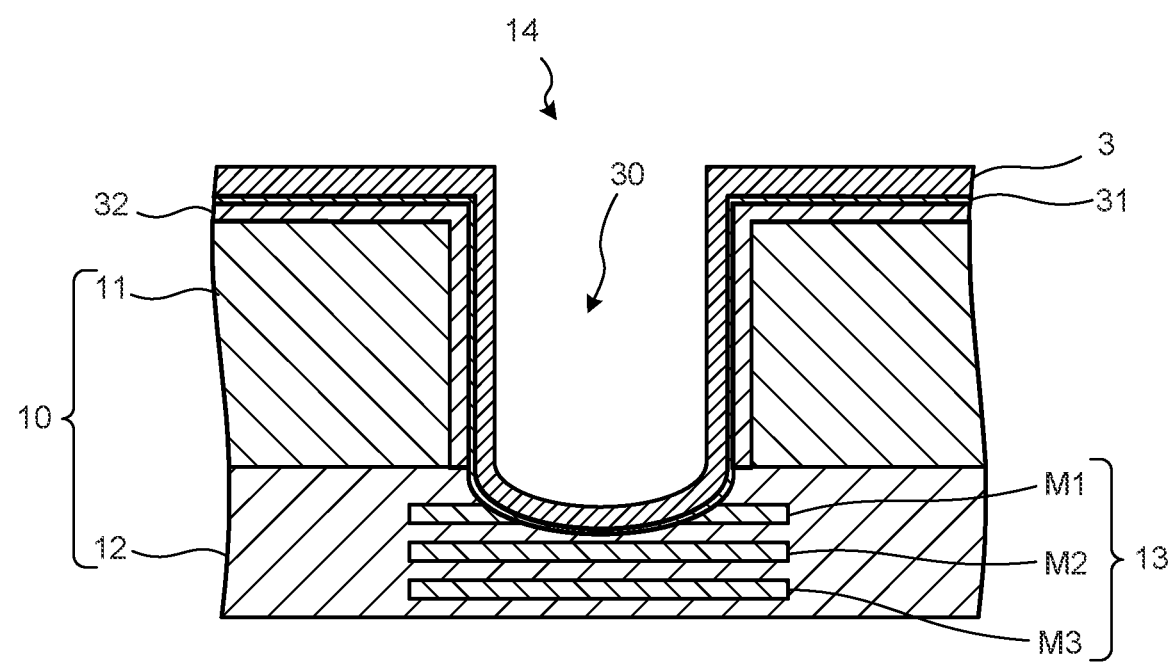
FIG. 2 is an explanatory diagram illustrating a cross-section of a TSV according to the embodiment of the present disclosure.

FIG. 2 is an explanatory diagram illustrating a cross-section of the TSV 14 according to the embodiment of the present disclosure. FIG. 2 selectively illustrates a portion near the TSV 14 in the logic board 10 out of components of the semiconductor device 1, and illustration of the sensor board 20 is omitted.

Moreover, in FIG. 2, the logic board 10 in a state in which the logic board 10 in FIG. 1 is reversed vertically is illustrated. Therefore, in the following, it is explained referring a bottom surface side of the logic board 10 in FIG. 1 as upward, and a top surface side of the logic board 10 as downward.

As illustrated in FIG. 2, the TSV 14 extends in a depth direction from the top surface of the logic board 10, and pierces through a first wiring layer M1 that is the upper most layer among the first wiring layer M1, a second wiring layer M2, and a third wiring layer M3 in the multi-layered wiring layer 13, and is connected to the first wiring layer M1 on a side peripheral surface.

The TSV 14 is formed by forming a seed metal film 31 and an RDL film sequentially on a surface of a through hole 30 that reaches such a depth that pierces through the first wiring layer M1 from a top surface of the Si substrate 11.

Between the Si substrate 11 and the seed metal film 31, an SiO film 32 is arranged in advance for insulation purposes. A specific formation process of the TSV 14 will be described later with reference to FIG. 3A to FIG. 4C.

Before forming the seed metal film 31 and the RDL film 3, it is necessary to etch the insulation layer 12 and the first wiring layer M1 in a process of forming the through hole 30 that reaches the depth to pierce through the first wiring layer M1 from the top surface of the logic board 10.

Therefore, the process of forming the through hole 30, the through hole 30 is formed by reactive ion etching (RIE) using an etching gas in which an etching gas suitable for etching of the insulation layer 12 and an etching gas suitable for etching of the first wiring layer M1 are mixed.

In the RIE, the etching proceeds toward the direction of depth of the logic board 10, but does not proceed toward a surface direction of the insulation layer 12. Therefore, a diameter of the through hole 30 in the insulation layer 12 is not to be larger than a diameter of the through hole 30 in the Si substrate 11.

Thus, occurrence of a step disconnection in the seed metal film 31 formed after the through hole 30 is formed is suppressed, and thereby enabling to form the RDL film 3 on the entire surface of the seed metal film 31 without a step disconnection.

On the other hand, general TSVs have a depth only reaching the top surface of the first wiring layer M1 from the top surface of the Si substrate 11, and is connected to the top surface of the first wiring layer M1 at the bottom surface. When forming such a general TSV, the first wiring layer M1 is used as an etching stopper, and a through hole having a depth reaching the top surface of the first wiring layer M1 from the top surface of the Si substrate 11 is formed by RIE.

In this RIE, an etching gas suitable for the insulation layer 12 is used, but an etching gas suitable for the first wiring layer M1 is not used. Therefore, when over-etching to completely expose the top surface of the first wiring layer M1 is performed, while etching in the depth direction stops at the top surface of the first wiring layer M1, etching in a surface direction in the insulation layer 12 continues to proceed.

As a result, the diameter of the through hole 30 in the insulation layer 12 becomes larger than the diameter of the through hole 30 in the Si substrate 11, and a notch (slit or cutout) is formed at a bottom portion of the through hole 30. When the seed metal film 31 is formed on a surface of this through hole 30, a step disconnection is generated in the seed metal film 31 at the notch portion at the bottom portion of the through hole 30, and the RDL film 3 that entirely covers the through hole 30 cannot be formed, resulting in causing a faulty connection in the TSV, to reduce the yields of semiconductor devices.

On the other hand, in the TSV 14 according to the embodiment, because the RDL film 3 is formed on the entire surface of the seed metal film 31 without step disconnection as described above, occurrence of a faulty connection in the TSV 14 can be suppressed, and the yields of the semiconductor device 1 can be improved.

Moreover, as illustrated in FIG. 2, in the TSV 14 according to the embodiment, a bottom portion has a tapered shape smoothly continuing from a vertical hole portion of the through hole 30, specifically, a bowl shape. Thus, according to the present embodiment, the step disconnection of the seed metal film 31 can be prevented more certainly and, therefore, occurrence of a faulty connection in the TSV 14 can be suppressed, to improve the yields of the semiconductor device 1.

Furthermore, because the TSV 14 according to the embodiment has the bottom portion in a bowl shape, a joint surface with the first wiring layer M1 is to be an inclined plane. Thus, the TSV 14 can provide a larger junction area with respect to the first wiring layer M1, compared to such a shape that the bottom portion is horizontal and completely pierce through the first wiring layer M1 to make the joint surface with respect to the first wiring layer M1 perpendicular thereto and, therefore, a junction resistance can be reduced.

Formation Process of TSV

Figure 3A:
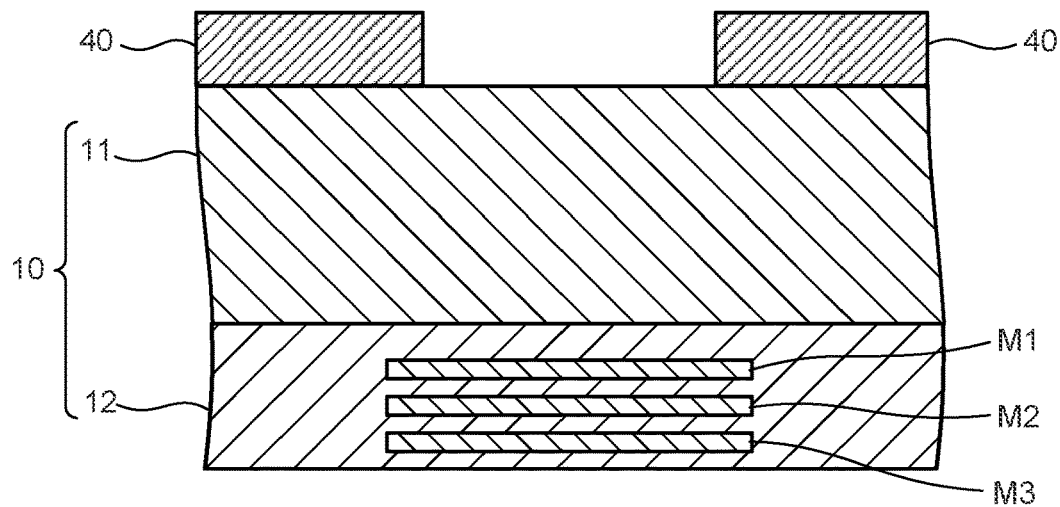
FIG. 3A is an explanatory diagram illustrating a TSV formation process according to the embodiment of the present disclosure.

Next, a formation process of the TSV 14 according to the embodiment will be explained with reference to FIG. 3A to FIG. 4C. When the TSV 14 is formed, first, a resist 40 is applied to the top surface of the Si substrate 11, and then patterning is performed on the resist 40 by photolithography to selectively remove the resist 40 at a portion at which the TSV 14 is formed as illustrated in FIG. 3A.

Figure 3B:
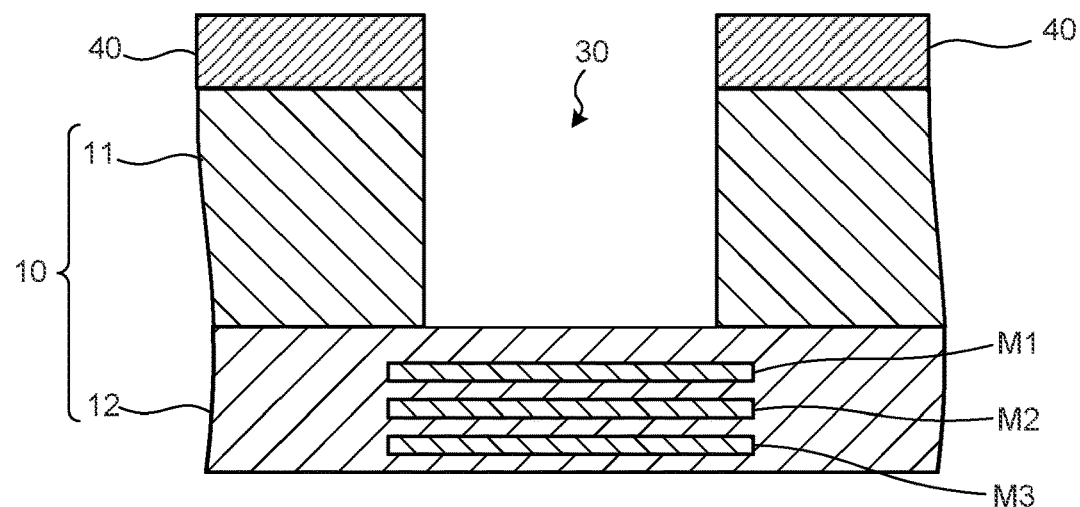
FIG. 3B is an explanatory diagram illustrating the TSV formation process according to the embodiment of the present disclosure.

At this time, for example, a hole in a substantially circular shape in planar view having a diameter of about 50 μm is formed in the resist 40. Subsequently, as illustrated in FIG. 3B, using the resist 40 as a mask, the through hole 30 is formed in the Si substrate 11 by performing dry etching, for example, RIE or the like.

In this etching, a chlorine-based or fluorine based etching gas that is suitable for Si (silicon) etching is used. Thus, a portion that is not masked by the resist 40 in the Si substrate 11 is etched in a depth direction by about 100 μm, to expose a top surface of the insulation layer 12.

Figure 3C:
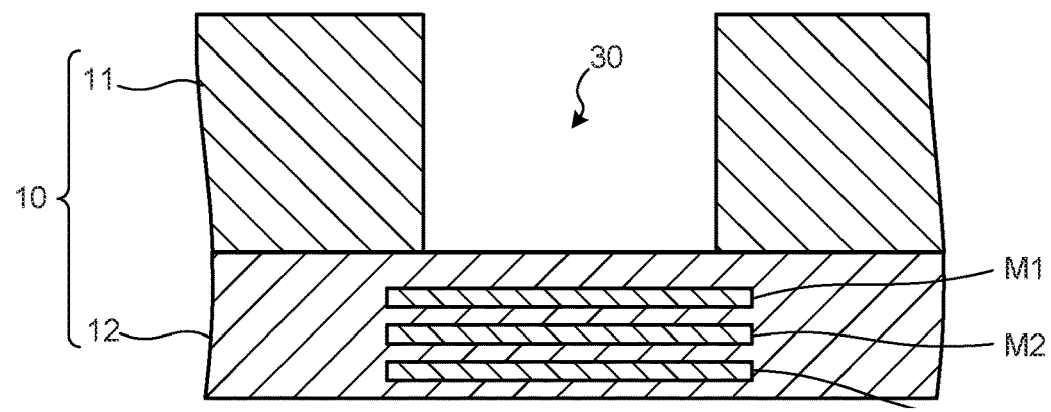
FIG. 3C is an explanatory diagram illustrating the TSV formation process according to the embodiment of the present disclosure.
Figure 4A:
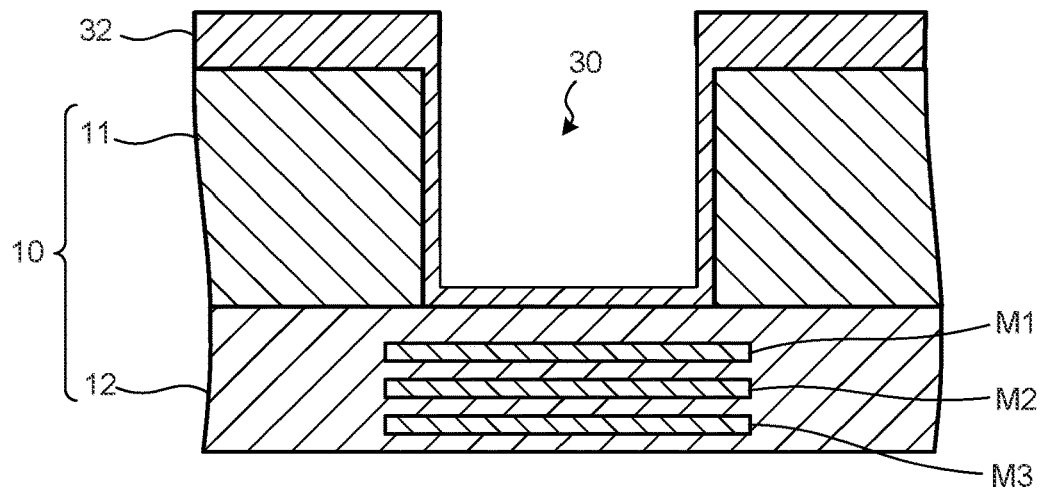
FIG. 4A is an explanatory diagram illustrating a TSV formation process according to the embodiment of the present disclosure.

Thereafter, as illustrated in FIG. 3C, the resist 40 is removed from the top surface of the Si substrate 11. Subsequently, as illustrated in FIG. 4A, to insulate between the Si substrate 11 and the RDL film 3 to be formed later, the SiO film 32 is formed, for example, by chemical vapor deposition (CVD) on the top surface of the Si substrate 11, and the bottom surface and the side peripheral surface of the through hole 30.

At this time, on the top surface of the Si substrate 11, the SiO film 32 having a thickness of about 5 μm is formed, and on the bottom surface and the side peripheral surface of the through hole 30, the SiO film 32 having a thickness of about 0.5 μm is formed. Thereafter, dry etching, for example, RIE or the like is performed on the entire surface of the SiO film 32.

In this etching, a fluorine-based etching gas that is suitable for etching of an insulation film and a chlorine-based etching gas that is suitable for metallic system etching are used. Furthermore, in this process, a fluorine carbide-based or hydro carbon-based gas that functions as a depot gas to suppress progress of etching in a horizontal direction is mixed to the etching gas to perform etching.

Figure 4B:
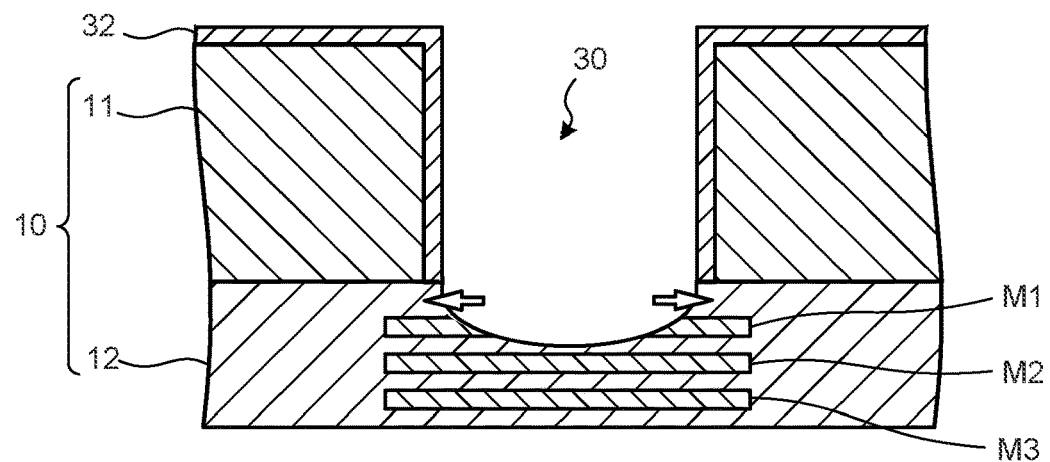
FIG. 4B is an explanatory diagram illustrating the TSV formation process according to the embodiment of the present disclosure.
Figure 4C:
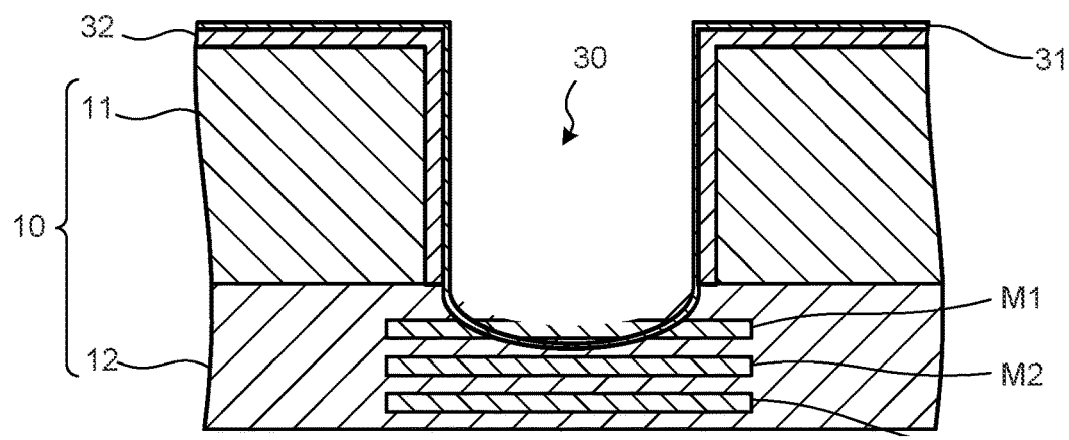
FIG. 4C is an explanatory diagram illustrating the TSV formation process according to the embodiment of the present disclosure.

Thus, as illustrated in FIG. 4B, the SiO film 32 formed on the bottom portion of the through hole 30, the insulation layer 12, and the first wiring layer M1 are sequentially etched, and the through hole 30 reaches the depth to pierce through the first wiring layer M1.

In the final phase of the etching, an amount of the etching gas is gradually decreased, while the depot gas is increased. This enables to avoid the etching from proceeding in the horizontal directions indicated by outlined arrows in FIG. 4B, and to make the bottom portion of the through hole 30 into a bowl shape. As described, the through hole 30 according to the present embodiment is formed such that the shape of the bottom portion becomes a bowl shape smoothly continuing from the vertical hole portion, without a notch formed in the bottom portion.

Thereafter, a depot film deposited on the surface of the through hole 30 is removed by an organic solution. Subsequently, a thin film of Ti (titanium), Cu (copper), or Ti (titanium) and Cu (copper) having a film thickness of 200 nm to 400 nm is formed by spattering on the bottom surface of the through hole 30, a side surface of the through hole 30, and the entire top surface of the SiO film 32, to form the seed metal film 31.

Finally, on the surface of the seed metal film 31, the RDL film 3 is formed by growing a Cu (copper) film having a film thickness of about 5 μm by electroplating, to thereby form the TSV 14 illustrated in FIG. 2. In the process of forming the RDL film 3, a portion other than a portion at which the RDL film 3 is formed is masked with a resist before performing the electroplating.

After formation of the RDL film 3, the resist is removed. At this time, if a notch is present at the bottom portion of the through hole 30, a residue of the resist remains in the notch, to be a cause of a crack in the RDL film 3. However, as described above, a notch is not formed in the bottom portion of the through hole 30 in the present embodiment. Thus, the TSV 14 according to the embodiment can suppress occurrence of a crack in the RDL film 3 and, therefore, can prevent the occurrence of a faulty connection.

Note that the shape of the TSV 14 illustrated in FIG. 2 is one example of the TSV according to the embodiment. The TSV according to the embodiment allows various modifications other than the shape illustrated in FIG. 2. In the following, the shape of the TSV according to modifications of the embodiment will be explained with reference to FIG. 5A to FIG. 8B.

Figure 5A:
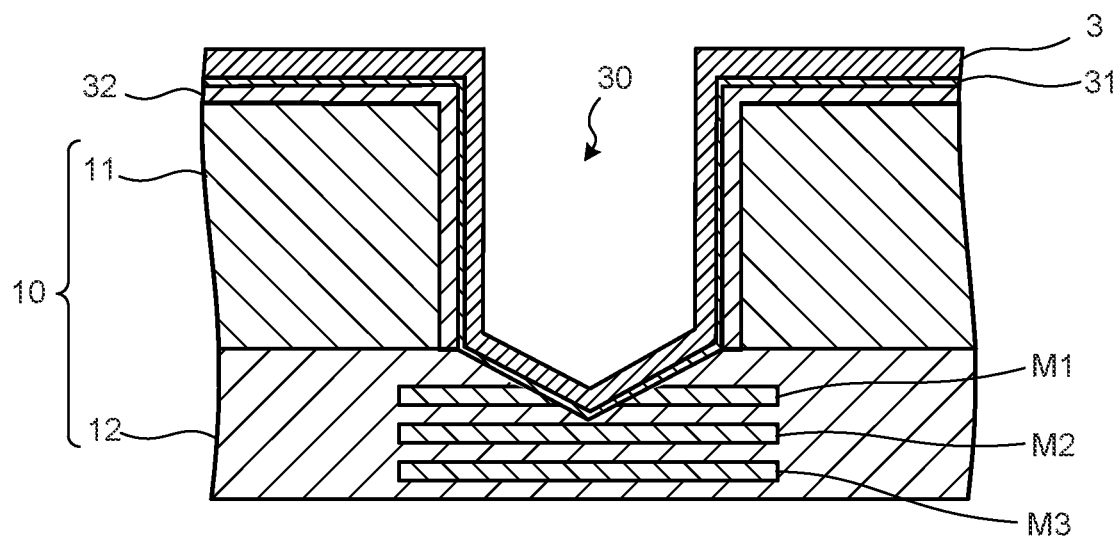
FIG. 5A is an explanatory diagram illustrating a cross-section of a TSV according to a first modification of the embodiment of the present disclosure.
Figure 5B:
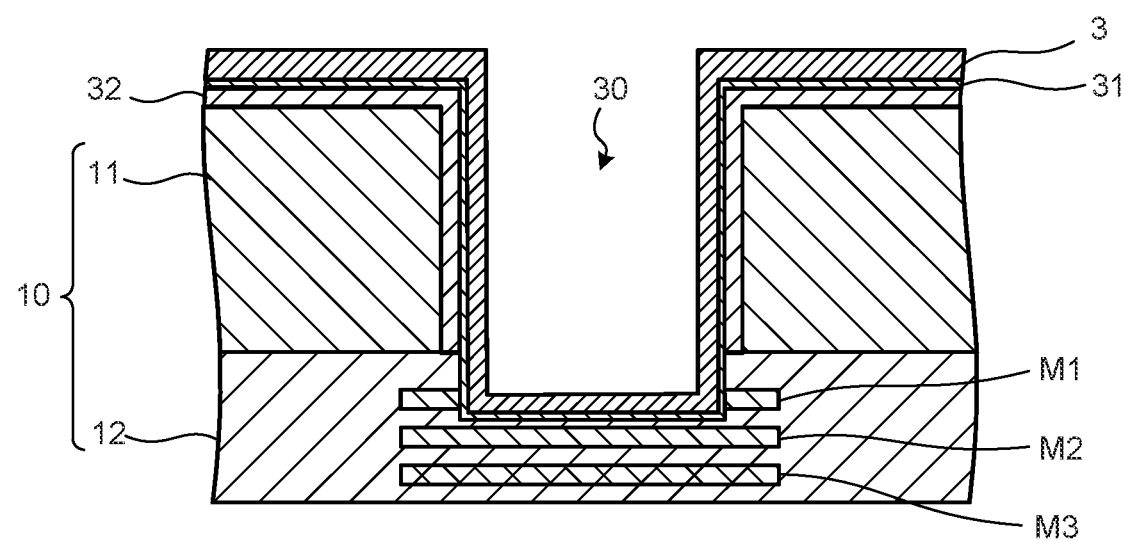
FIG. 5B is an explanatory diagram illustrating a cross-section of a TSV according to a second modification of the embodiment of the present disclosure.
Figure 6A:
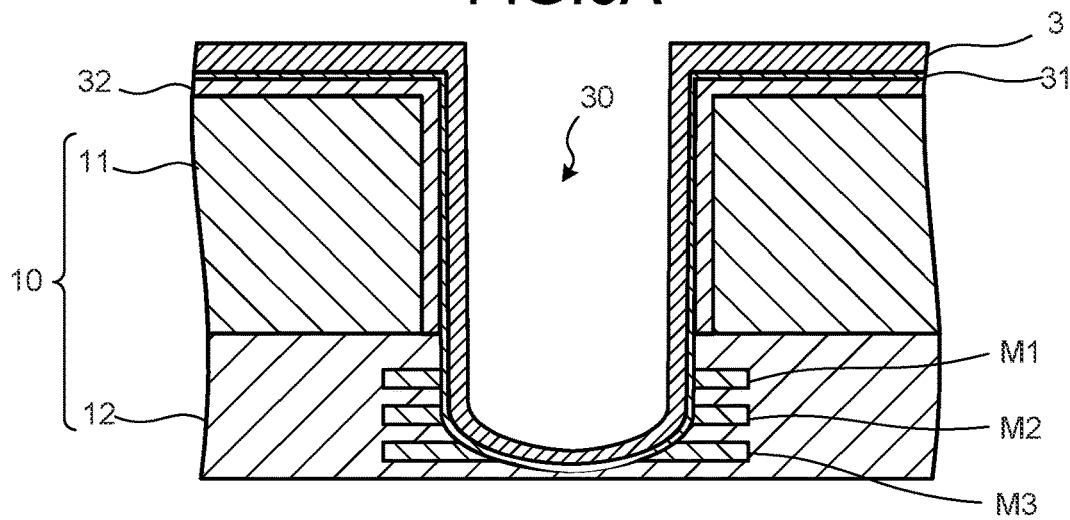
FIG. 6A is an explanatory diagram illustrating a cross-section of a TSV according to a third modification of the embodiment of the present disclosure.
Figure 6B:
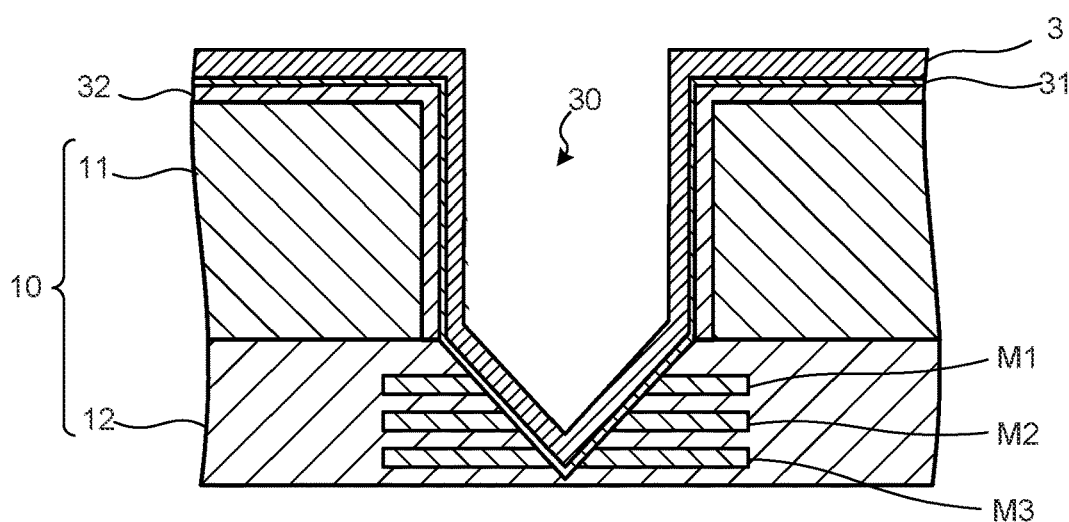
FIG. 6B is an explanatory diagram illustrating a cross-section of a TSV according to a fourth modification of the embodiment of the present disclosure.
Figure 6C:
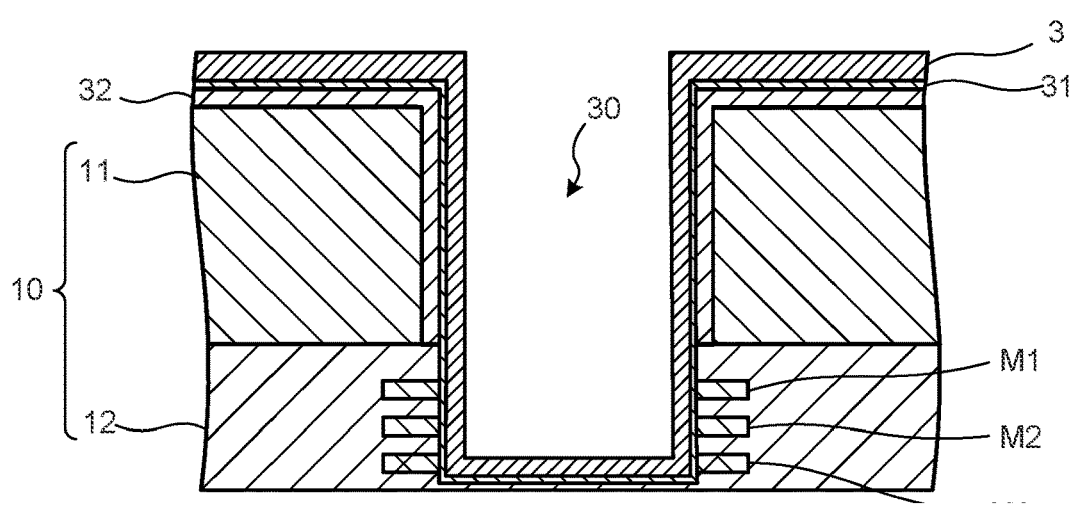
FIG. 6C is an explanatory diagram illustrating a cross-section of a TSV according to a fifth modification of the embodiment of the present disclosure.

FIG. 5A is an explanatory diagram illustrating a cross-section of a TSV according to a first modification of the embodiment. FIG. 5B is an explanatory diagram illustrating a cross-section of a TSV according to a second modification of the embodiment. FIG. 6A is an explanatory diagram illustrating a cross-section of a TSV according to a third modification of the embodiment. FIG. 6B is an explanatory diagram illustrating a cross-section of a TSV according to a fourth modification of the embodiment. FIG. 6C is an explanatory diagram illustrating a cross-section of a TSV according to a fifth modification of the embodiment.

Figure 7A:
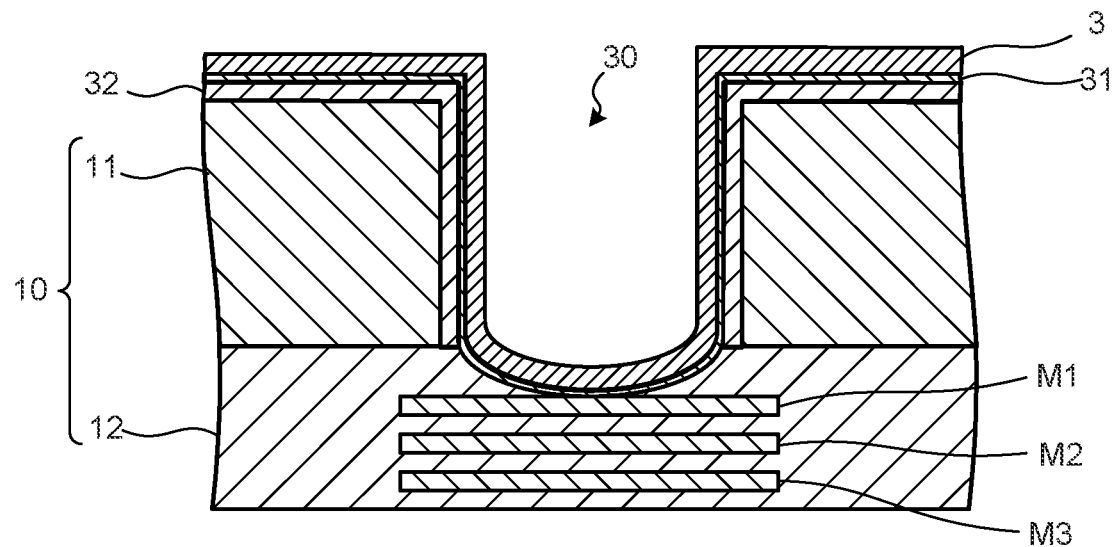
FIG. 7A is an explanatory diagram illustrating a cross-section of a TSV according to a sixth modification of the embodiment of the present disclosure.
Figure 7B:
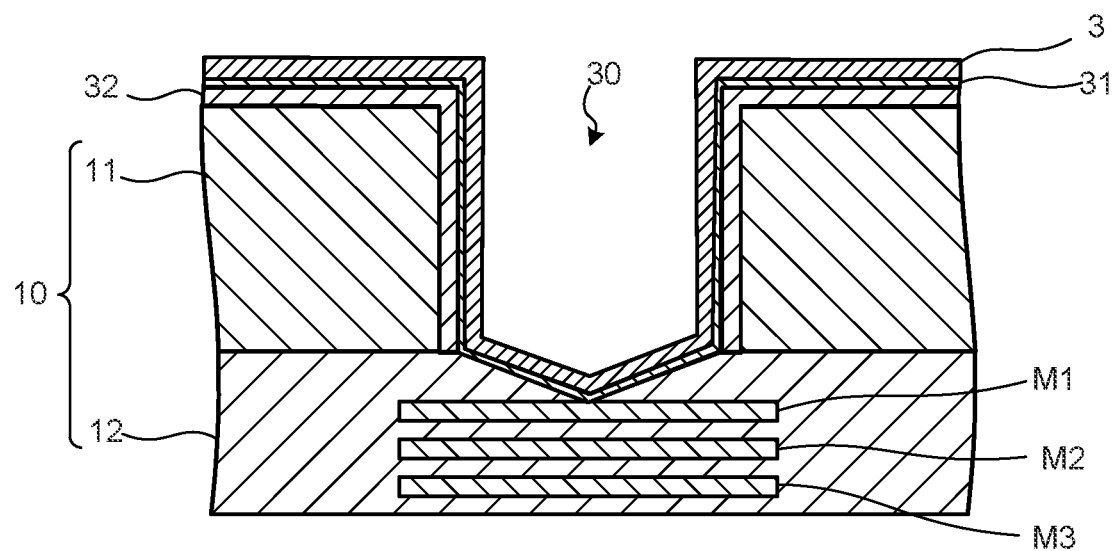
FIG. 7B is an explanatory diagram illustrating a cross-section of a TSV according to a seventh modification of the embodiment of the present disclosure.
Figure 8A:
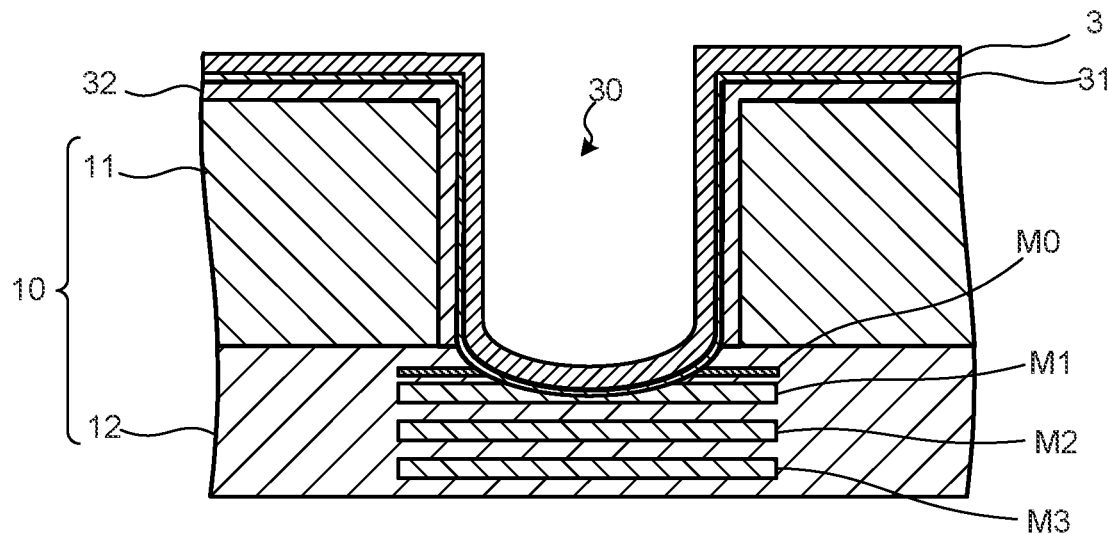
FIG. 8A is an explanatory diagram illustrating a cross-section of a TSV according to an eighth modification of the embodiment of the present disclosure.
Figure 8B:
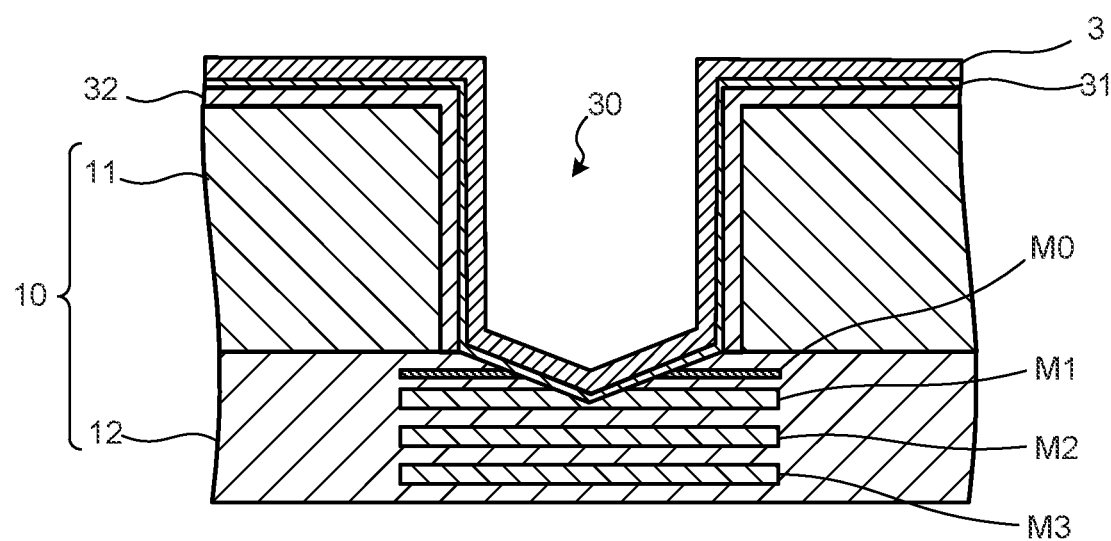
FIG. 8B is an explanatory diagram illustrating a cross-section of a TSV according to a ninth modification of the embodiment of the present disclosure.

Moreover, FIG. 7A is an explanatory diagram illustrating a cross-section of a TSV according to a sixth modification of the embodiment. FIG. 7B is an explanatory diagram illustrating a cross-section of a TSV according to a seventh modification of the embodiment. FIG. 8A is an explanatory diagram illustrating a cross-section of a TSV according to an eighth modification of the embodiment. FIG. 8B is an explanatory diagram illustrating a cross-section of a TSV according to a ninth modification of the embodiment.

As illustrated in FIG. 5A, the TSV according to the first modification differs from the TSV 14 illustrated in FIG. 2 in only the shape of the bottom portion, and the bottom portion has a conical shape that becomes thinner as it goes deeper. The conical-shaped bottom portion can be formed by performing ratio adjustment in amount of the etching gas to an amount of the depot gas in the final phase of the etching to form the through hole 30.

The TSV according to the first modification reaches the depth to pierce through the first wiring layer M1 similarly to the TSV 14 illustrated in FIG. 2, and is connected to the first wiring layer M1 on the side peripheral surface. The TSV is formed without using the first wiring layer M1 as an etching stopper.

Therefore, because a notch is not formed at the bottom portion in the TSV according to the first modification, occurrence of a faulty connection in the RDL film 3 is suppressed, and the yields of semiconductor devices can be thereby improved.

Moreover, in the TSV according to the first modification, because the joint surface with the first wiring layer M1 is an inclined plane, a large junction area with the first wiring layer M1 can be provided similarly to the TSV 14 illustrated in FIG. 2, and a junction resistance can be reduced.

Moreover, as illustrated in FIG. 5B, the TSV according to the second modification differs from the TSV 14 illustrated in FIG. 2 in only the shape of the bottom portion, and the bottom portion has a shape of horizontal plane. The bottom portion in a horizontal planer shape can be formed by completing etching without changing an amount of the etching gas and an amount of the depot gas in the final phase of the etching to form the through hole 30.

The TSV according to the second modification reaches the depth to pierce through the first wiring layer M1 similarly to the TSV 14 illustrated in FIG. 2, and is connected to the first wiring layer M1 on the side peripheral surface. The TSV is formed without using the first wiring layer M1 as an etching stopper.

Therefore, because a notch is not formed at the bottom portion in the TSV according to the second modification, occurrence of a faulty connection in the RDL film 3 is suppressed, and the yields of semiconductor devices can be improved.

Moreover, as illustrated in FIG. 6A, the TSV according to the third modification differs from the TSV 14 illustrated in FIG. 2 only in a point that the depth in the logic board 10 is deeper than the TSV 14 illustrated in FIG. 2, and reaches a depth to pierce through the third wiring layer M3.

Furthermore, as illustrated in FIG. 6B, the TSV according to the fourth modification differs from the TSV according to the first modification illustrated in FIG. 5A only in a point that the depth in the logic board 10 is deeper than the TSV of the first modification illustrated in FIG. 5A, and reaches a depth to pierce through the third wiring layer M3.

Moreover, as illustrated in FIG. 6C, the TSV according to the fifth modification differs from the TSV according to the second modification illustrated in FIG. 5B only in a point that the depth in the logic board 10 is deeper than the TSV of the second modification illustrated in FIG. 5B, and reaches a depth to pierce through the third wiring layer M3.

According to the TSV of these third to fifth modifications, the first to the third wiring layers M1, M2, M3 can be connected at once, and similarly to the TSV 14 illustrated in FIG. 2, occurrence of a faulty connection in the RDL film 3 is suppressed, and can thereby improve the yields of the semiconductor devices.

The TSVs of the third to the fifth modifications may have a depth to pierce through the second wiring layer M2. That is, as long as the TSV according to the embodiment has the depth to pierce through a wiring layer, the number of wiring layers to be pierced through is not limited.

Furthermore, as long as the TSV according to the embodiment has a tapered shape at the bottom portion, it is not necessarily required to pierce through a wiring layer. For example, as illustrated in FIG. 7A, the TSV according to the sixth modification is connected to the top surface of the first wiring layer M1 at the bottom surface, without piercing through the first wiring layer M1. The shape of the bottom surface of the sixth modification is a bowl shape similar to that of the TSV 14 illustrated in FIG. 2.

When forming such a TSV, the through hole 30 is formed using the first wiring layer M1 as an etching stopper. However, in the final phase of the etching to form the through hole 30, a ratio adjustment of an amount of the etching gas to an amount of the depot gas is performed, to make the bottom portion of the through hole 30 into a bowl shape. This enables to prevent formation of a notch in the bottom portion of the through hole 30.

Therefore, the TSV of the sixth modification suppresses occurrence of a faulty connection in the RDL film 3 similarly to the TSV 14 illustrated in FIG. 2, and can thereby improve the yields of the semiconductor devices.

Moreover, as illustrated in FIG. 7B, the TSV according to the seventh modification is connected to the top surface of the first wiring layer M1 at a distal end portion in a bottom portion in a conical shape, without piercing through the first wiring layer M1. With this TSV also, similarly to the TSV illustrated in FIG. 7A, occurrence of a faulty connection in the RDL film 3 is suppressed, and can thereby improve the yields of the semiconductor devices.

Furthermore, the TSV according to the embodiment can be applied, for example, at a shallower position than the first wiring layer M1 in the insulation layer 12 of the logic board 10, for example, to a semiconductor device in which a wiring layer formed with a metallic material, such as tungsten, is provided.

For example, as illustrated in FIG. 8A, the TSV according to the eight modification pierces through a metallic wiring layer M0, such as a local inter connect (LIC) formed with a metal of tungsten or the like provided on the shallowest layer in the insulation layer 12, and is connected to the metallic wiring layer M0 on the side peripheral surface. The bottom portion of the TSV of the eighth modification is in a bowl shape.

Moreover, as illustrated in FIG. 8B, the TSV according to the ninth modification pierces through the metallic wiring layer M0, and is connected to the metallic wiring layer M0 on the side peripheral surface. The bottom portion of the TSV of the ninth modification is in a conical shape. As described, the TSVs according to the eight and the ninth modifications can improve the yields of semiconductor devices having an LIC by applying to the semiconductor devices having an LIC.

The effects described in the present specification are only examples and are not limited, and other effects can be produced also.

Note that the present technique can apply structures as follows also.

(1) A semiconductor device including:
    a board in which a wiring layer is embedded; and
    a via that extends in a depth direction from a main surface of the board to pierce through the wiring layer, and that is connected to the wiring layer on a side peripheral surface.

(2) The semiconductor device according to the above-mentioned (1), wherein
    the via has a bottom portion in a tapered shape.

(3) The semiconductor device according to the above-mentioned (2), wherein
    the via has the bottom portion in a bowl shape.

(4). The semiconductor device according to the above-mentioned (2), wherein
    the via has the bottom portion in a conical shape.

(5) The semiconductor device according to the above-mentioned (2), wherein
    the via has the bottom portion in a planar shape.

(6) The semiconductor device according to the abovementioned (1), wherein
the via pierces through a plurality of the wiring layers laminated.
(7) The semiconductor device according to the abovementioned (1), wherein
the via is connected to a wiring layer that is formed with a metallic material arranged on a shallowest layer out of a plurality of the wiring layers laminated.
(8) A semiconductor device including:
a board in which a wiring layer is embedded; and
a via that extends in a depth direction from a main surface of the board, and that is connected to a surface of the wiring layer at a part of a bottom portion in a tapered shape.

REFERENCE SIGNS LIST

1 SEMICONDUCTOR DEVICE
10 LOGIC BOARD
11 Si SUBSTRATE
12 INSULATION LAYER
13 MULTI-LAYERED WIRING LAYER
14 TSV
15 SOLDER BUMP
20 SENSOR BOARD
12 Si SUBSTRATE
22 GLASS COVER
23 SUPPORTING MEMBER
24 CMOS IMAGE SENSOR
25 MICRO LENS
3 RDL FILM
31 SEED METAL FILM
32 SiO FILM
M0 METALLIC WIRING LAYER
M1 FIRST WIRING LAYER
M2 SECOND WIRING LAYER
M3 THIRD WIRING LAYER
100 MOUNTING BOARD
101 CONNECTING TERMINAL

What is claimed is:

1. A semiconductor device, comprising:
a board in which a wiring layer is embedded; and
a via that extends in a depth direction from a main surface of the board to pierce through the wiring layer,
wherein the via is connected to the wiring layer on a side peripheral surface of the via,
wherein the via has a bottom portion in a bowl shape, and
wherein the wiring layer includes a plurality of laminated wirings and wherein the via pierces completely through the plurality of the laminated wirings.

2. A semiconductor device, comprising:
a board in which a wiring layer is embedded; and
a via that extends in a depth direction from a main surface of the board to pierce through the wiring layer,
wherein the via is connected to the wiring layer on a side peripheral surface of the via,
wherein the via has a bottom portion in a bowl shape, and
wherein the via is connected to a tungsten wiring arranged closest to the via than the plurality of laminated wirings.

3. The semiconductor device according to claim 2, wherein the via pierces through a first laminated wiring of the plurality of laminated wirings closest to the via.

4. The semiconductor device according to claim 1, wherein the board includes a silicon substrate layer and an insulation layer.

5. The semiconductor device according to claim 4, wherein wiring layer is provided within the insulation layer.

6. The semiconductor device according to claim 1, wherein the via is connected to a solder bump provided outside of the board.

7. The semiconductor device according to claim 6, wherein the solder bump is connected to a connecting terminal.

8. The semiconductor device according to claim 2, wherein the via pierces through the tungsten wiring.

9. A semiconductor device, comprising:
a board in which a wiring layer is embedded; and
a via that extends in a depth direction from a main surface of the board to pierce through the wiring layer,
wherein the via is connected to the wiring layer on a side peripheral surface of the via,
wherein the via has a bottom portion in a conical shape, and
wherein the wiring layer includes a plurality of laminated wirings and wherein the via pierces completely through the plurality of the laminated wirings.

10. The semiconductor device according to claim 9, wherein the board includes a silicon substrate layer and an insulation layer.

11. The semiconductor device according to claim 10, wherein wiring layer is provided within the insulation layer.

12. The semiconductor device according to claim 9, wherein the via is connected to a solder bump provided outside of the board.

13. The semiconductor device according to claim 12, wherein the solder bump is connected to a connecting terminal.

* * * * *